(12) United States Patent
Hsu et al.

(10) Patent No.: US 7,817,485 B2
(45) Date of Patent: Oct. 19, 2010

(54) MEMORY TESTING SYSTEM AND MEMORY MODULE THEREOF

(75) Inventors: Jen-Shou Hsu, Hsinchu (TW); Kuo-Cheng Ting, Hsinchu County (TW)

(73) Assignee: Etron Technology, Inc., Hsinchu (TW)

( * ) Notice: Subject to any disclaimer, the term of this patent is extended or adjusted under 35 U.S.C. 154(b) by 230 days.

(21) Appl. No.: 12/269,891

(22) Filed: Nov. 13, 2008

(65) Prior Publication Data

US 2009/0273996 A1 Nov. 5, 2009

(30) Foreign Application Priority Data

May 5, 2008 (TW) .............................. 97116493 A

(51) Int. Cl.
*G11C 29/00* (2006.01)
(52) U.S. Cl. .................. 365/201; 365/149; 365/189.07; 365/230.04; 365/230.06
(58) Field of Classification Search ................. 365/201, 365/149, 189.07, 230.04, 230.06
See application file for complete search history.

(56) References Cited

U.S. PATENT DOCUMENTS

| 5,640,353 A | * | 6/1997 | Ju | ............................... | 365/200 |
| 6,061,262 A | * | 5/2000 | Schultz et al. | ........... | 365/49.16 |
| 7,099,221 B2 | * | 8/2006 | Klein | ......................... | 365/222 |

* cited by examiner

*Primary Examiner*—Pho M Luu
(74) *Attorney, Agent, or Firm*—Winston Hsu; Scott Margo; Min-Lee Teng

(57) ABSTRACT

A testing system with data compressing function includes a third data end, a first encoder, and a second encoder. The testing system receives testing data and testing address for testing if any memory cell fails in a memory. The memory includes a first data end, a second end, and an address end. The first encoder encodes the testing data to the data type of the first data end according to the testing address. The second encoder encodes the testing data to the data type of the second data end according to the testing address. In this way, the corresponding memory cells of the first data and second ends store same testing data.

20 Claims, 14 Drawing Sheets

MEMORY TESTING SYSTEM AND MEMORY MODULE THEREOF

BACKGROUND OF THE INVENTION

1. Field of the Invention

The present invention relates to a memory testing system, and more particularly, to a memory testing system with data compressing function.

2. Description of the Prior Art

Please refer to FIG. 1. FIG. 1 is a diagram illustrating a conventional memory module 100 being written with data compressing function. As shown in FIG. 1, the memory module 100 comprises a testing system 110 and a Dynamic Random Access Memory (DRAM) 120. The memory module 100 comprises four data ends $D_0$, $D_1$, $D_2$, and $D_3$, and an address end A. Similarly, the DRAM 120 comprises the corresponding data ends $D_0'$, $D_1'$, $D_2'$, and $D_3'$, and an address end A'. The memory module 100 is disposed for inputting addresses to the address end A for accessing data stored in the DRAM 120 through the data ends $D_0$, $D_1$, $D_2$, and $D_3$. During the testing procedure, the memory module 100 uses data compressing function for writing data into the DRAM 120. More particularly, the testing system 110 short-circuits the data ends $D_0'$, $D_1'$, $D_2'$, and $D_3'$, and inputs testing data TD to the data end $D_0$ and inputs testing address RA to the address end A. In this way, the testing data TD can be written into the DRAM 120 through the data ends $D_0$~$D_3$ to the memory cells corresponding to the data ends $D_0'$~$D_3'$ and the testing address RA. Furthermore, the testing address RA can be a row address. For example, when the testing address RA is [00], it represents the word line $WL_0$, when the testing address RA is [01], it represents the word line $WL_1$, when the testing address RA is [10], it represents the word line $WL_2$, and when the testing address RA is [11], it represents the word line $WL_3$.

Please refer to FIG. 2. FIG. 2 is a diagram illustrating a conventional memory module 100 reading data with the data compressing function. After the testing procedure with data compressing of FIG. 1 is done (the testing data is written into the corresponding memory cells), the testing system 100 reads the stored testing data with the same manner as the writing procedure with the data compression. That is, the testing system 110 input the same testing address RA to the corresponding address end A' of the DRAM 120 through the address end A. In this way, the corresponding memory cells of the DRAM 120 output previously written testing data to the comparator $CMP_1$ through the data ends $D_0'$~$D_3'$. Thus, the comparator $CMP_1$ compares the received data, and determines if the received data are all the same and accordingly outputs a comparing signal $S_1$ to the data end $D_0$. Meanwhile, the data end $D_0'$ also outputs the stored data $S_2$ (the previously testing data) to the data end $D_0$. In this way, a user can determines if the memory cell corresponding to the testing address RA is failed according to the comparing signal $S_1$, the stored data $S_2$, and the testing data TD. More particularly, when the comparing signal $S_1$ determines that the received data of the comparator $CMP_1$ are not entirely the same, it means that failed memory cells exist in the memory cells corresponding to the address RA; when the comparing signal $S_1$ determines that the received data of the comparator $CMP_1$ are entirely the same, it can be further determined if failed memory cells exist in the memory cells corresponding to the address RA by comparing the stored data $S_2$ and the testing data TD. In such condition, if the stored data $S_2$ and the testing data TD are the same, it means that no failed memory cells exist in the memory cells corresponding to the address RA; if the stored data $S_2$ is not the same as the testing data TD, it means that failed memory cells exist in the memory cells corresponding to the address RA.

Please refer to FIG. 3 and FIG. 4 together. FIG. 3 and FIG. 4 are diagrams illustrating memory cells of two different types in a DRAM. As shown in FIG. 3, the switch $SW_1$ is controlled by the word line WL. When the word line WL controls the switch $SW_1$ to turn on, the memory cell $X_1$ receives data from the bit line BL through the switch $SW_1$. When the data transmitted from the bit line BL is logic "0", the memory cell $X_1$ stores the data as logic "0"; on the other hand, when the data transmitted from the bit line BL is logic "1", the memory cell $X_1$ stores the data as logic "1". As shown in FIG. 4, the switch $SW_2$ is controlled by the word line WL. When the word line WL controls the switch $SW_2$ to turn on, the memory cell $X_2$ receives data from the bit line BLB through the switch $SW_2$. When the data transmitted from the bit line BLB is logic "1", the memory cell $X_2$ stores the data as logic "0"; on the other hand, when the data transmitted from the bit line BLB is logic "0", the memory cell $X_2$ stores the data as logic "1".

Please refer to FIG. 5 and FIG. 6 together. FIG. 5 and FIG. 6 are diagrams illustrating the depositions of the memory cells in DRAMs. As shown in FIG. 5 and FIG. 6, the memory cells are interwoven by the bit lines BL and BLB of the data ends $D_0'$~$D_3'$ and the word lines $WL_0$~$WL_7$ of the address end (the corresponding row addresses RA are [000]~[111]). As shown in FIG. 5 (only take row addresses $WL_3$~$WL_0$ for example, the rest addresses are similar), when the data stored in the all corresponding memory cells are all logic "1", the logic "1" is written at the data ends $D_1'$~$D_3'$ by the row address $WL_3$, the logic "0" is written at the data ends $D_1'$~$D_3'$ by the row address $WL_2$, the logic "0" is written at the data ends $D_1'$~$D_3'$ by the row address $WL_1$, and the logic "1" is written at the data ends $D_1'$~$D_3'$ by the row address $WL_0$. In this way, the sixteen memory cells corresponding to the row addresses $WL_3$~$WL_0$ and the data ends $D_1'$~$D_3'$ all store logic "1". As shown in FIG. 6 (only take row addresses $WL_3$~$WL_0$ for example, the rest addresses are similar), when the data stored in the all corresponding memory cells are all logic "0", the logic "0" is written at the data ends $D_1'$~$D_3'$ by the row address $WL_3$, the logic "1" is written at the data ends $D_0'$~$D_3'$ by the row address $WL_2$, the logic "1" is written at the data ends $D_1'$~$D_3'$ by the row address $WL_1$, and the logic "0" is written at the data ends $D_1'$~$D_3'$ by the row address $WL_0$. In this way, the sixteen memory cells corresponding to the row addresses $WL_3$~$WL_0$ and the data ends $D_1'$~$D_3'$ all store logic "0". Only the memory cells disposed as disclosed in FIG. 5 and FIG. 6 can be testified if any failed by the data compressing manner disclosed as in FIG. 1 and FIG. 2.

Please refer to FIG. 7 and FIG. 8 together. FIG. 7 and FIG. 8 are diagrams illustrating other depositions of memory cells in DRAMs. As shown in FIG. 7 and FIG. 8, the memory cells are also interwoven by the bit lines BL and BLB of the data ends $D_1'$~$D_3'$ and the word lines $WL_0$~$WL_7$ of the address end (the corresponding row addresses RA are [000]~[111]). As shown in FIG. 7 (only take row addresses $WL_3$~$WL_0$ for example, the rest addresses are similar), if the logic "1" is written at the data ends $D_1'$~$D_3'$ by the row address $WL_3$, the memory cells corresponding to the data ends $D_0'$ and $D_2'$ store logic "1", but the memory cells corresponding to the data ends $D_1'$ and $D_3'$ store logic "0". In such condition, the memory cells corresponding to the row address $WL_3$ cannot store same logic data by writing same logic data. As shown in FIG. 8 (only take row addresses $WL_3$~$WL_0$ for example, the rest addresses are similar), if the logic "0" is written at the data ends $D_1'$~$D_3'$ by the row address $WL_3$, the memory cells corresponding to the data ends $D_0'$ and $D_2'$ store logic "0", but the memory cells corresponding to the data ends $D_1'$ and $D_3'$ store logic "1". In such condition, the memory cells corresponding to the row address $WL_3$ cannot store same logic data by writing same logic data. Therefore, the memory cells disposed as disclosed in FIG. 7 and FIG. 8 cannot be testified if any failed by the data compressing manner disclosed as in FIG. 1 and FIG. 2.

SUMMARY OF THE INVENTION

The present invention provides a testing system for a memory. The memory comprises a first memory cell, a second memory cell, a first data end, a second data end, and an address end. The testing system comprises a third data end for receiving a testing data; a first encoder coupled to the third data end, the first data end, and the address end, for encoding the testing data to a first encoded data according to a testing address and transmitting the first encoded data to the first memory cell through the first data end; and a second encoder coupled to the third data end, the second data end, and the address end, for encoding the testing data to a second encoded data according to the testing address and transmitting the second encoded data to the second memory cell through the second data end.

The present invention further provides a testing system for a memory. The memory comprises a first memory cell, a second memory cell, a first data end, a second data end, and an address end. The testing system comprises a third data end for receiving a testing data; a first decoder coupled to the third data end, the first data end, and the address end, for reading a first encoded data from the first memory cell and decoding the first encoded data in order to generate a first decoded data according to a testing address; a second decoder coupled to the second data end, and the address end, for reading a second encoded data from the second memory cell and decoding the second encoded data in order to generate a second decoded data according to the testing address; and a comparator coupled to the first decoder and the second decoder, for determining if the first decoded data and the second decoded data are the same.

The present invention further provides a memory module. The memory module receives a testing signal for being testing during a testing procedure. The memory module receives a normal operation signal for operating regularly during a normal operation. The memory module comprises a third data end, for accessing data, and receiving a testing data when during the testing procedure; a fourth data end, for accessing data; a second address end, for receiving address information and receiving a testing address during the testing procedure; a first switch, comprising a first end coupled to the third data end; a control end for receiving the normal operation signal; and a second end; wherein when the control end of the first switch receives the normal operation signal, the first end of the first switch is coupled to the second end of the first switch; a second switch, comprising a first end coupled to the fourth data end; a control end for receiving the normal operation signal; and a second end; wherein when the control end of the second switch receives the normal operation signal, the first end of the second switch is coupled to the second end of the second switch; a third switch, comprising a first end coupled to the third data end; a control end for receiving the testing signal; and a second end; wherein when the control end of the third switch receives the testing signal, the first end of the third switch is coupled to the second end of the third switch; a fourth switch, comprising a first end coupled to the third data end; a control end for receiving the testing signal; and a second end; wherein when the control end of the fourth switch receives the testing signal, the first end of the fourth switch is coupled to the second end of the fourth switch; a memory, comprising a first data end, coupled to the second end of the first switch; a second data end, coupled to the second end of the second switch; a first address end, coupled to the second address end, for receiving the address information and the testing address; a first memory cell, coupled to the first data end and the first address end; and a second memory cell, coupled to the second data end and the first address end; a first encoder, coupled between the second end of the third switch, the first data end, and the second address end, for encoding the testing data to a first encoded data according to the testing address and transmitting the first encoded data to the first memory cell through the first data end; and a second encoder, coupled between the second end of the fourth switch, the second data end, and the second address end, for encoding the testing data to a second encoded data according to the testing address and transmitting the second encoded data to the second memory cell through the second data end.

The present invention further provides a memory module. The memory module receives a testing signal for being testing during a testing procedure. The memory module receives a normal operation signal for operating regularly during a normal operation. The memory module comprises a third data end, for accessing data, and receiving a testing data when during the testing procedure; a fourth data end, for accessing data; a second address end, for receiving address information and receiving a testing address during the testing procedure; a first switch, comprising a first end coupled to the third data end; a control end for receiving the normal operation signal; and a second end; wherein when the control end of the first switch receives the normal operation signal, the first end of the first switch is coupled to the second end of the first switch; a second switch, comprising a first end coupled to the fourth data end; a control end for receiving the normal operation signal; and a second end; wherein when the control end of the second switch receives the normal operation signal, the first end of the second switch is coupled to the second end of the second switch; a fifth switch, comprising a first end coupled to the third data end; a control end for receiving the testing signal; and a second end; wherein when the control end of the fifth switch receives the testing signal, the first end of the fifth switch is coupled to the second end of the fifth switch; a memory, comprising a first data end, coupled to the second end of the first switch; a second data end, coupled to the second end of the second switch; a first address end, coupled to the second address end, for receiving the address information and the testing address; a first memory cell, coupled to the first data end and the first address end; and a second memory cell, coupled to the second data end and the first address end; a first decoder coupled to the first data end, the second address end, and the second end of the fifth switch, for reading a first encoded data from the first memory cell and decoding the first encoded data in order to generate a first decoded data according to the testing address; a second decoder coupled to the second data end, and the second address end, for reading a second encoded data from the second memory cell and decoding the second encoded data in order to generate a second decoded data according to the testing address; and a comparator coupled to the first decoder and the second decoder, for determining if the first decoded data and the second decoded data are the same.

These and other objectives of the present invention will no doubt become obvious to those of ordinary skill in the art after reading the following detailed description of the preferred embodiment that is illustrated in the various figures and drawings.

DETAILED DESCRIPTION

Figure 9:
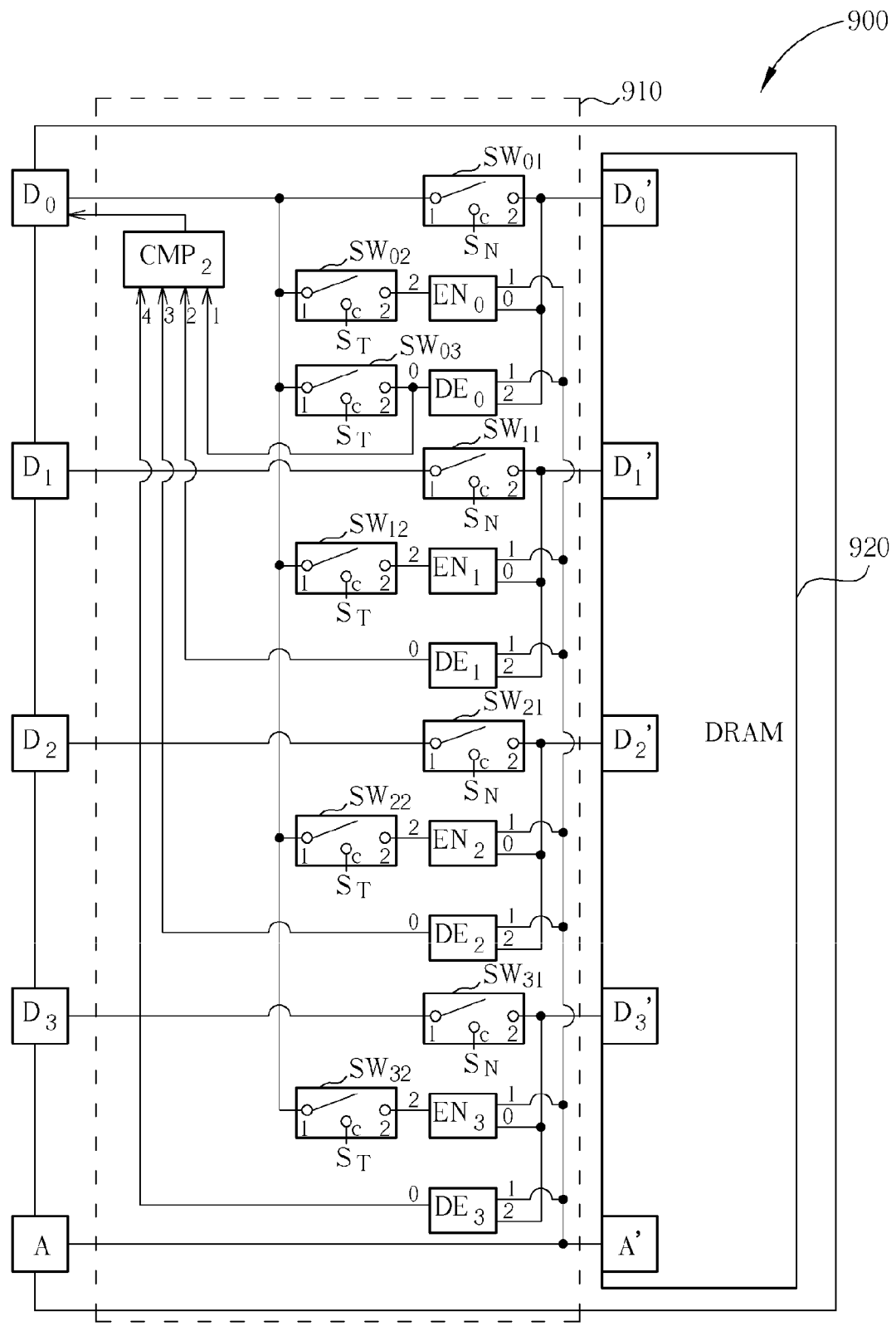
FIG. 9 is a diagram illustrating the memory module of the present invention.

Please refer to FIG. 9. FIG. 9 is a diagram illustrating the memory module 900 of the present invention. As shown in FIG. 9, the memory module 900 comprises a testing system 910 and a DRAM 920. The memory module comprises four data ends $D_0$~$D_3$ and an address end A. Similarly, the DRAM 920 comprises corresponding four data ends $D_1'$~$D_3'$ and a corresponding address end A'. The memory module 900 accesses data through the data ends $D_0$~$D_3$ from the DRAM 920 by inputting addresses to the address end A. The testing system 910 comprises nine switches $SW_{01}$, $SW_{02}$, $SW_{03}$, $SW_{11}$, $SW_{12}$, $SW_{21}$, $SW_{22}$, $SW_{31}$, and $SW_{32}$, four encoders $EN_0$, $EN_1$, $EN_2$, and $EN_3$, four decoders $DE_0$, $DE_1$, $DE_2$, and $DE_3$, and a comparator $CMP_2$. Each of the switches comprises a first end 1, a second end 2, and a control end C. Each of the switches controls the connections between its first end 1 and the second 2. That is, when a switch receives a control signal on its control end C, the connection between its first end 1 and the second end 2 is established; on the other hand, when the switch does not receive the control signal on its control end C, the connection between its first end 1 and the second end 2 is not established. Each of the encoders comprises two input ends 1 and 2, and an output end O. Each of the decoders comprises two input ends 1 and 2, and an output end O.

The first end 1 of the switch $SW_{01}$ is coupled to the data end $D_0$; the second end 2 of the switch $SW_{01}$ is coupled to the data end $D_0'$; the control end C of the switch $SW_{01}$ receives the normal operation signal $S_N$. The first end 1 of the switch $SW_{02}$ is coupled to the data end $D_0$; the second end 2 of the switch $SW_{02}$ is coupled to the input end 2 of the encoder $EN_0$; the control end C of the switch $SW_{02}$ receives the testing signal $S_T$. The first end 1 of the switch $SW_{03}$ is coupled to the data end $D_0$; the second end 2 of the switch $SW_{03}$ is coupled to the output end O of the decoder $DE_0$; the control end C of the switch $SW_{03}$ receives the testing signal $S_T$.

The first end 1 of the switch $SW_{11}$ is coupled to the data end $D_1$; the second end 2 of the switch $SW_{11}$ is coupled to the data end $D_1'$; the control end C of the switch $SW_{11}$ receives the normal operation signal $S_N$. The first end 1 of the switch $SW_{12}$ is coupled to the data end $D_0$; the second end 2 of the switch $SW_{12}$ is coupled to the input end 2 of the encoder $EN_1$; the control end C of the switch $SW_{12}$ receives the testing signal $S_T$.

The first end 1 of the switch $SW_{21}$ is coupled to the data end $D_2$; the second end 2 of the switch $SW_{21}$ is coupled to the data end $D_2'$; the control end C of the switch $SW_{21}$ receives the normal operation signal $S_N$. The first end 1 of the switch $SW_{22}$ is coupled to the data end $D_0$; the second end 2 of the switch $SW_{22}$ is coupled to the input end 2 of the encoder $EN_2$; the control end C of the switch $SW_{22}$ receives the testing signal $S_T$.

The first end 1 of the switch $SW_{31}$ is coupled to the data end $D_3$; the second end 2 of the switch $SW_{31}$ is coupled to the data end $D_3'$; the control end C of the switch $SW_{31}$ receives the normal operation signal $S_N$. The first end 1 of the switch $SW_{32}$ is coupled to the data end $D_0$; the second end 2 of the switch $SW_{32}$ is coupled to the input end 2 of the encoder $EN_3$; the control end C of the switch $SW_{32}$ receives the testing signal $S_T$.

The output end O of the encoder $EN_0$ is coupled to the data end $D_0'$; the output end O of the encoder $EN_1$ is coupled to the data end $D_1'$; the output end O of the encoder $EN_2$ is coupled to the data end $D_2'$; the output end O of the encoder $EN_3$ is coupled to the data end $D_3'$; the input ends 1 of the encoders $EN_0$~$EN_3$ are all coupled to the address end A.

The input end 2 of the decoder $DE_0$ is coupled to the data end $D_0'$; the input end 2 of the decoder $DE_1$ is coupled to the data end $D_1'$; the input end 2 of the decoder $DE_2$ is coupled to the data end $D_2'$; the input end 2 of the decoder $DE_3$ is coupled to the data end $D_3'$; the input ends 1 of the decoders $DE_0$~$DE_3$ are all coupled to the address end A; the output ends O of the decoders $DE_0$~$DE_3$ are coupled to the input ends 1, 2, 3, and 4 of the comparator $CMP_2$, respectively.

Figure 10:
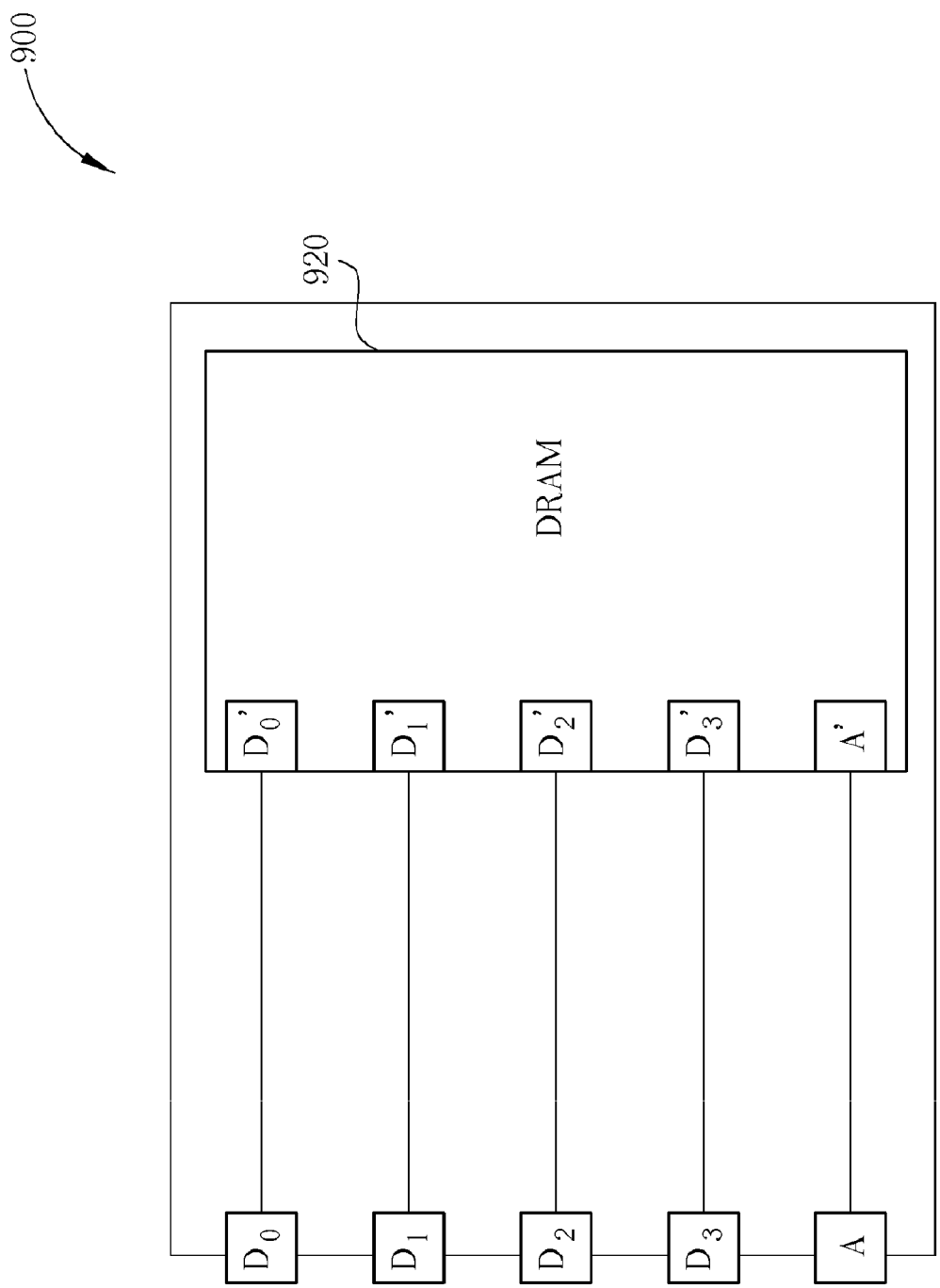
FIG. 10 is a diagram illustrating the memory module of the present invention during normal operation.

Please refer to FIG. 10. FIG. 10 is a diagram illustrating the memory module 900 of the present invention during normal operation. As shown in FIG. 10, during the normal operation, the normal operation signal $S_N$ is generated. Therefore, the switches $SW_{01}$, $SW_{11}$, $SW_{21}$, and $SW_{31}$ are turned on and the connection relationship is formed as disclosed in FIG. 10. In this way, a user can input addresses at the address end A to the address end A' of the DRAM 920 for accessing data to the DRAM 920 through the data ends $D_0$~$D_3$ and $D_1'$~$D_3'$.

Figure 11:
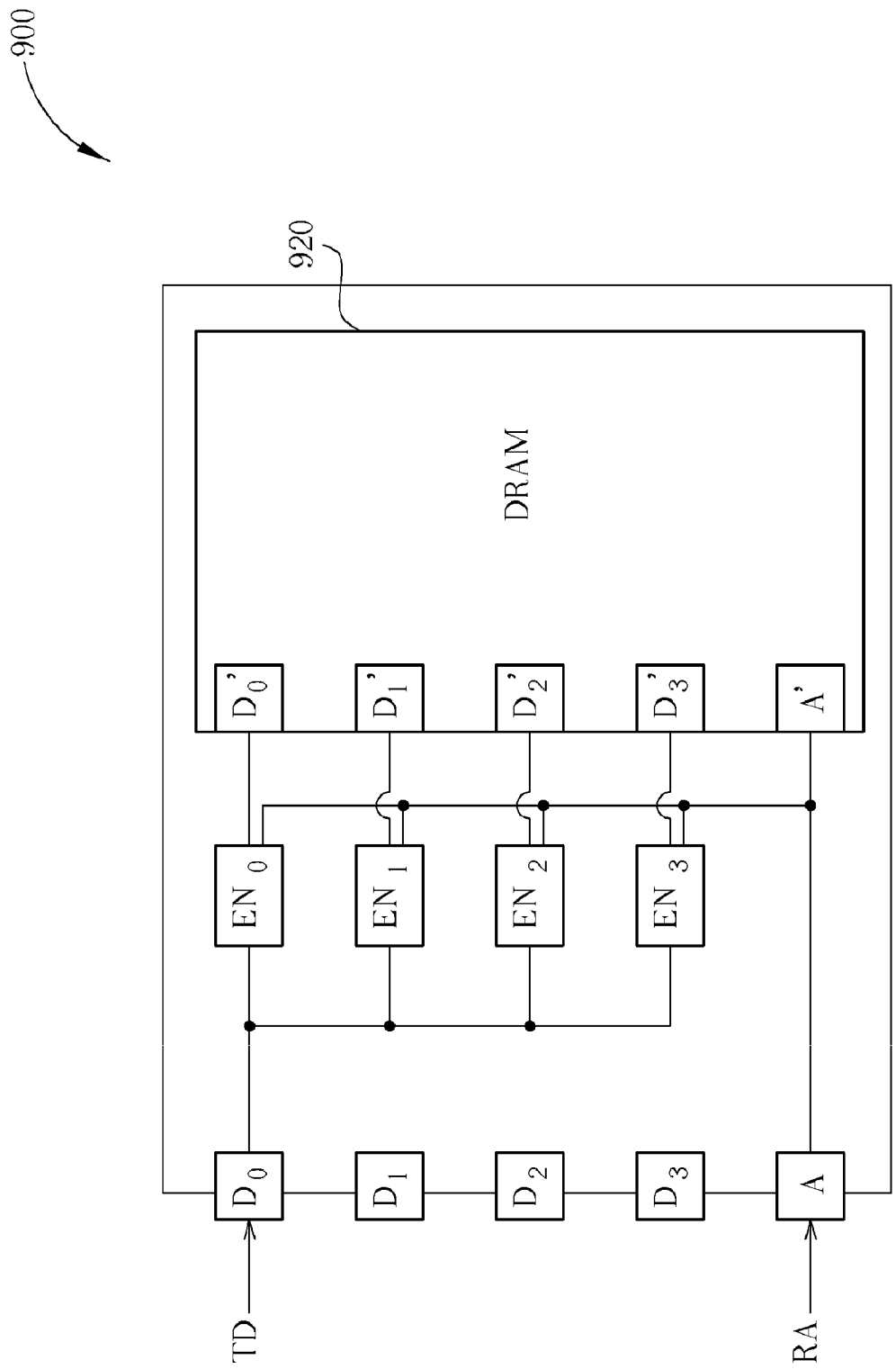
FIG. 11 is a diagram illustrating the memory module of the present invention during the testing procedure with data compressing manner.

Please refer to FIG. 11. FIG. 11 is a diagram illustrating the memory module 900 of the present invention during the testing procedure with data compressing manner. As shown in FIG. 11, during the testing procedure, the testing signal $S_T$ is generated. Therefore, the switches $SW_{02}$, $SW_{03}$, $SW_{12}$, $SW_{22}$, and $SW_{32}$ are turned on and the connection relationship is formed as disclosed in FIG. 11. In this way, a user input the address RA at the address end A to the address end A' of the DRAM 920 for transmitting testing data TD through the data end $D_0$, and then through the encoders $EN_0$~$EN_3$ to the data ends $D_1'$~$D_3'$ of the DRAM 920. According to the aforementioned description from FIG. 5 to FIG. 8, it is known that the manners of the encoders $EN_0$~$EN_3$ have to be modified as the disposition of the memory cells of the DRAM for achieving storing the testing data TD into the corresponding memory cells with the data compressing manner and the corresponding memory cell storing same logic data. Therefore, under the condition that the disposition of the memory cells of the DRAM is known, the encoders $EN_0$~$EN_3$ encode data with corresponding types according to the row address RA for allowing the final stored data in the corresponding memory cells to be the same logic. More particularly, the encoders $EN_0$~$EN_3$ can be designed with encoding rules corresponding to the actual disposition of the memory cells of the DRAM in order to allow the stored data in the corresponding memory cells to be the same logic.

Figure 1:
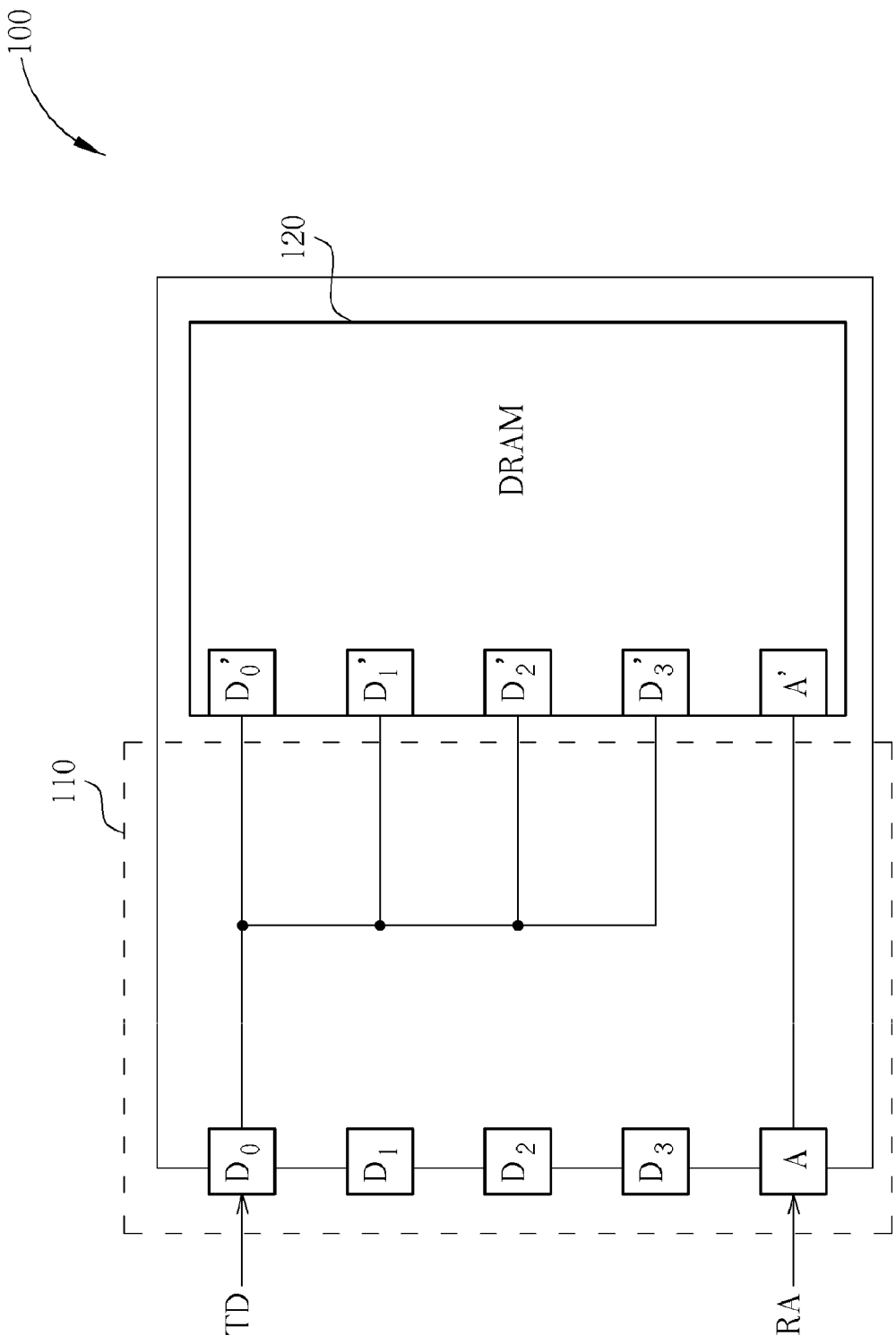
FIG. 1 is a diagram illustrating a conventional memory module 100 being written with data compressing function.
Figure 2:
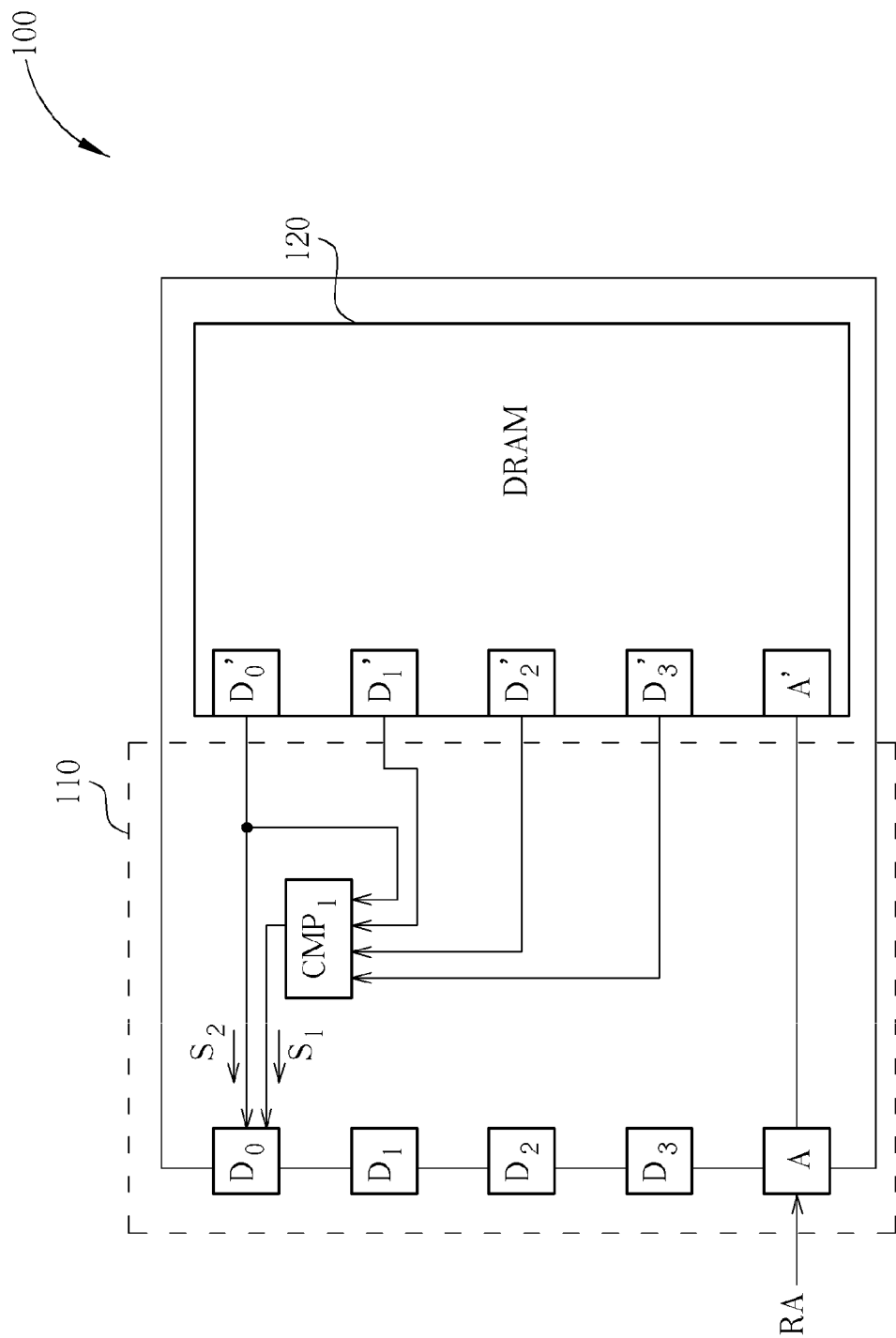
FIG. 2 is a diagram illustrating a conventional memory module 100 reading data with the data compressing function.
Figure 3:
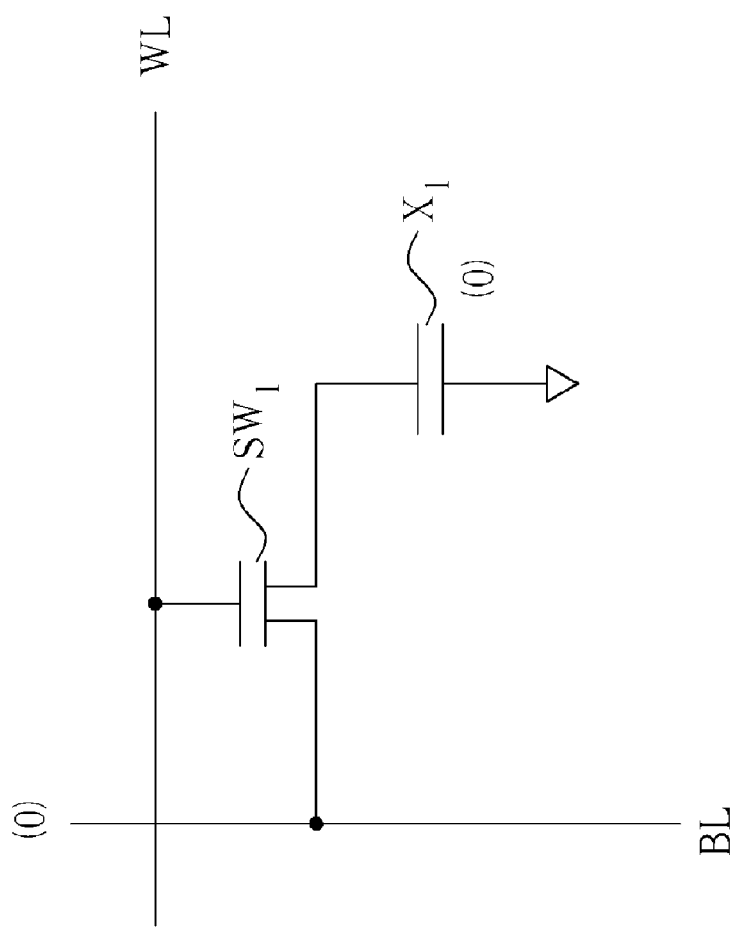
FIG. 3 and FIG. 4 are diagrams illustrating memory cells of two different types in a DRAM.
Figure 4:
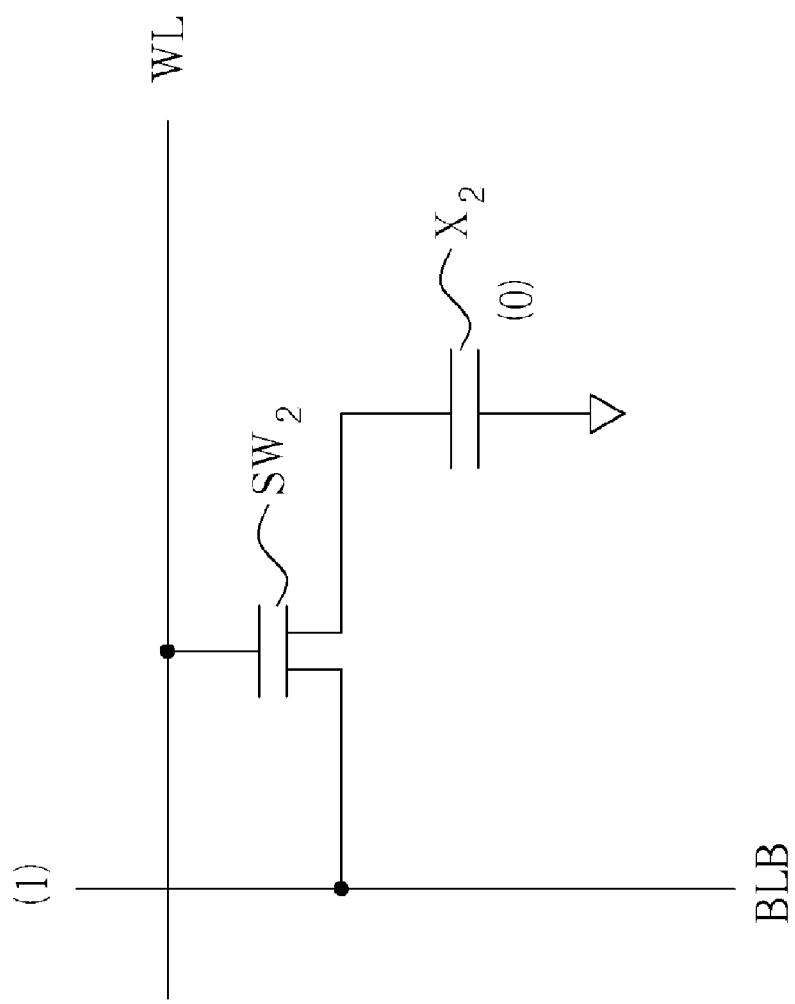
Figure 5:
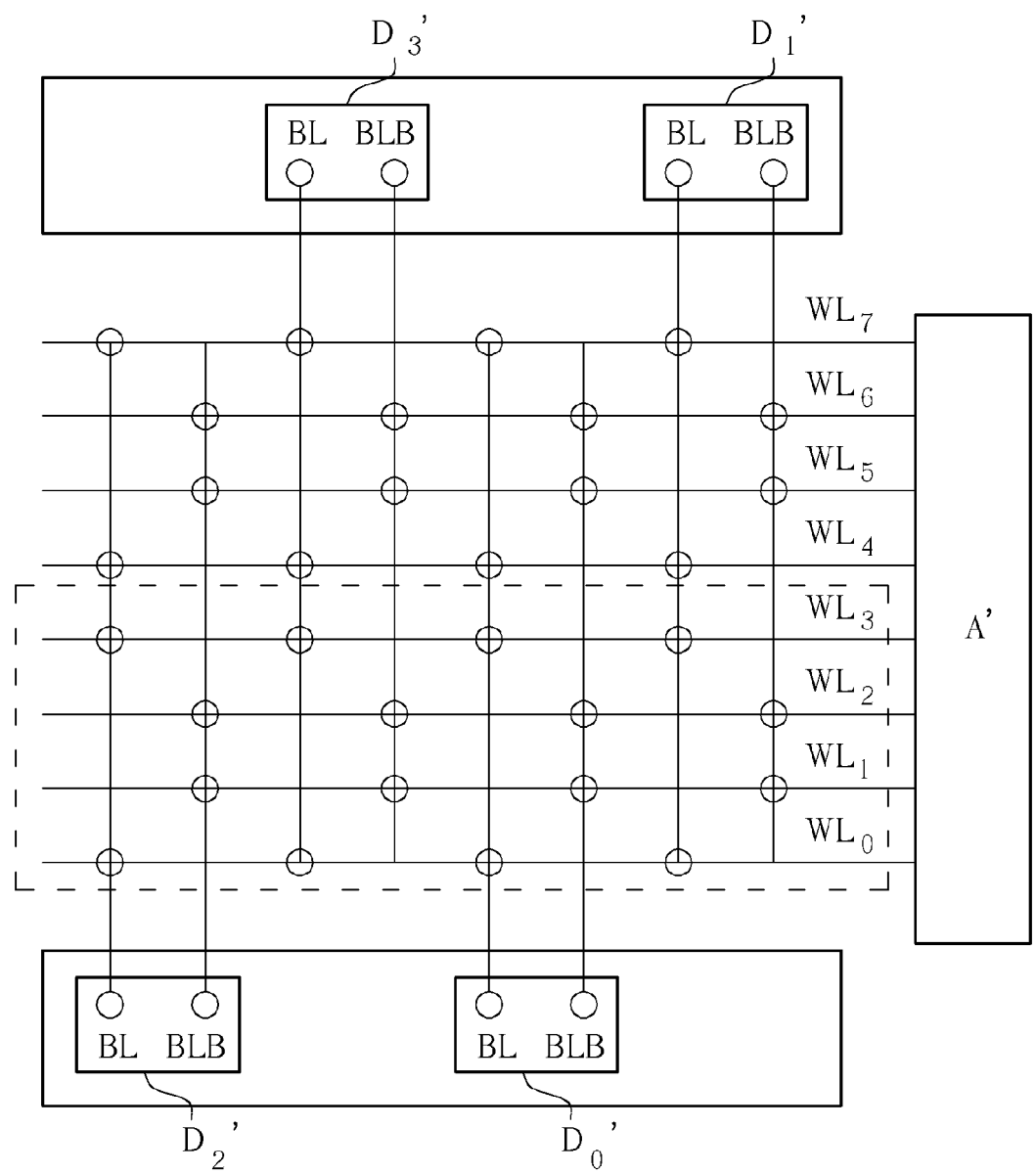
FIGS. 5, 6, 7, and 8 are diagrams illustrating the depositions of the memory cells in DRAMs.
Figure 6:
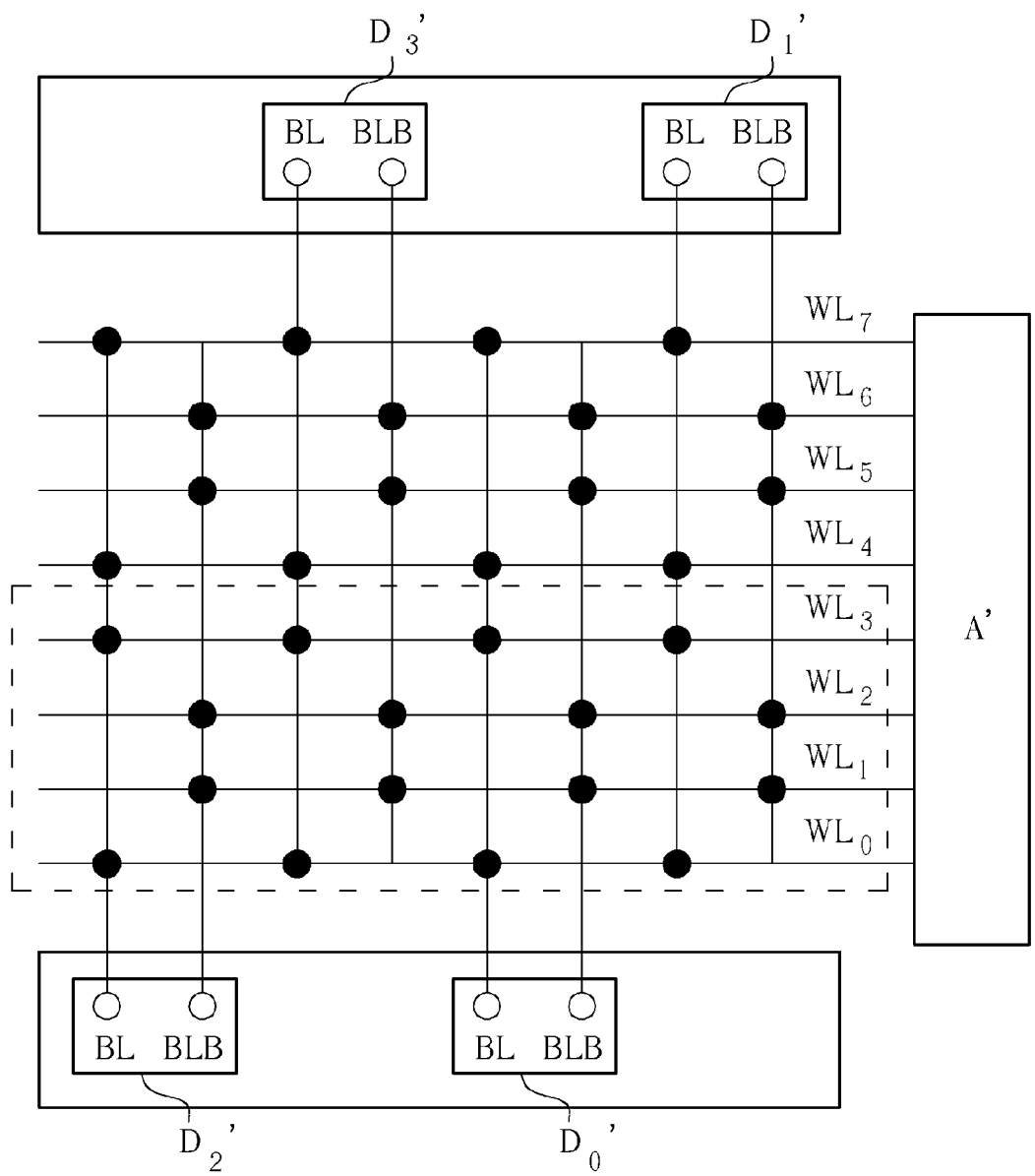
Figure 7:
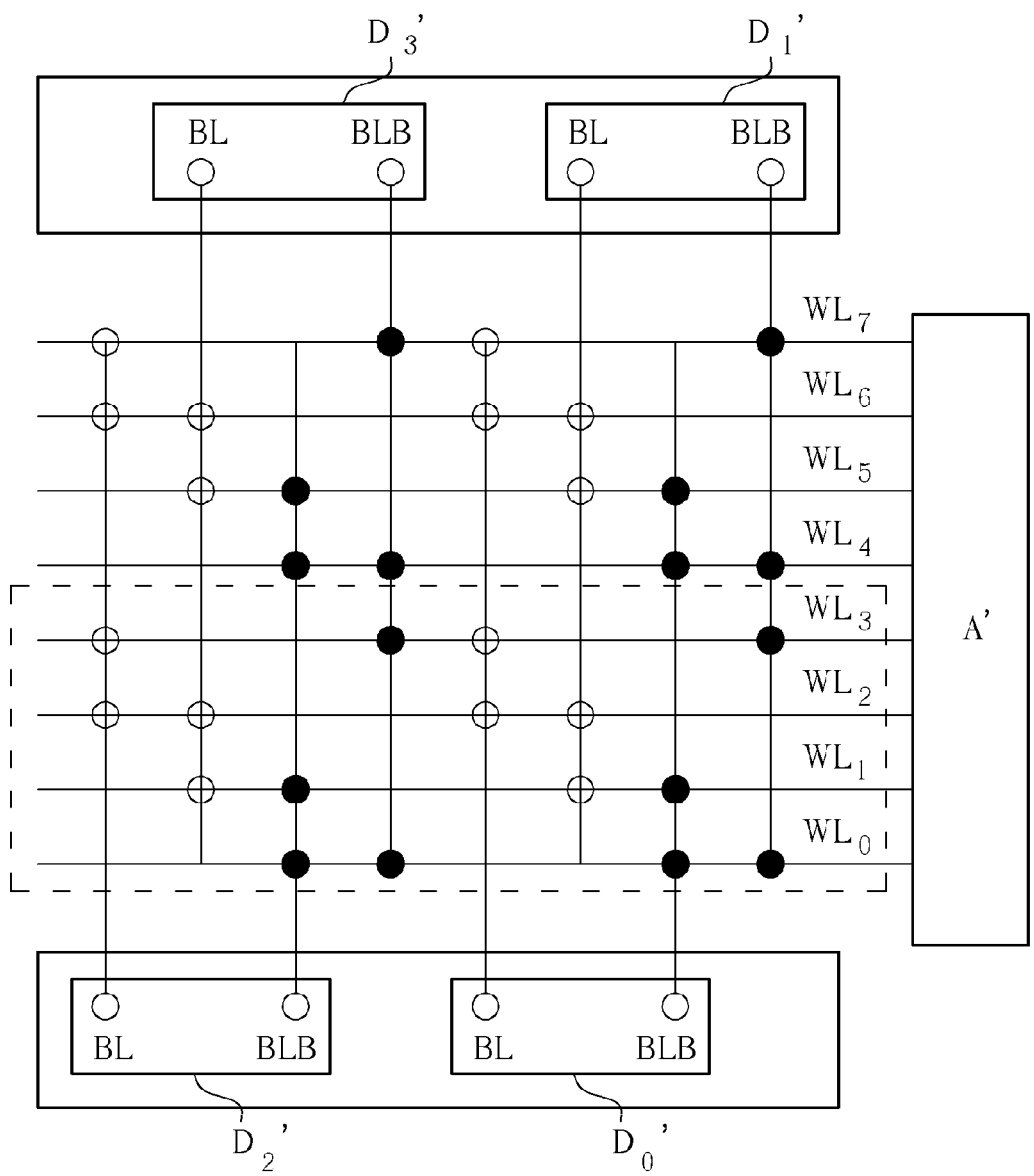
Figure 8:
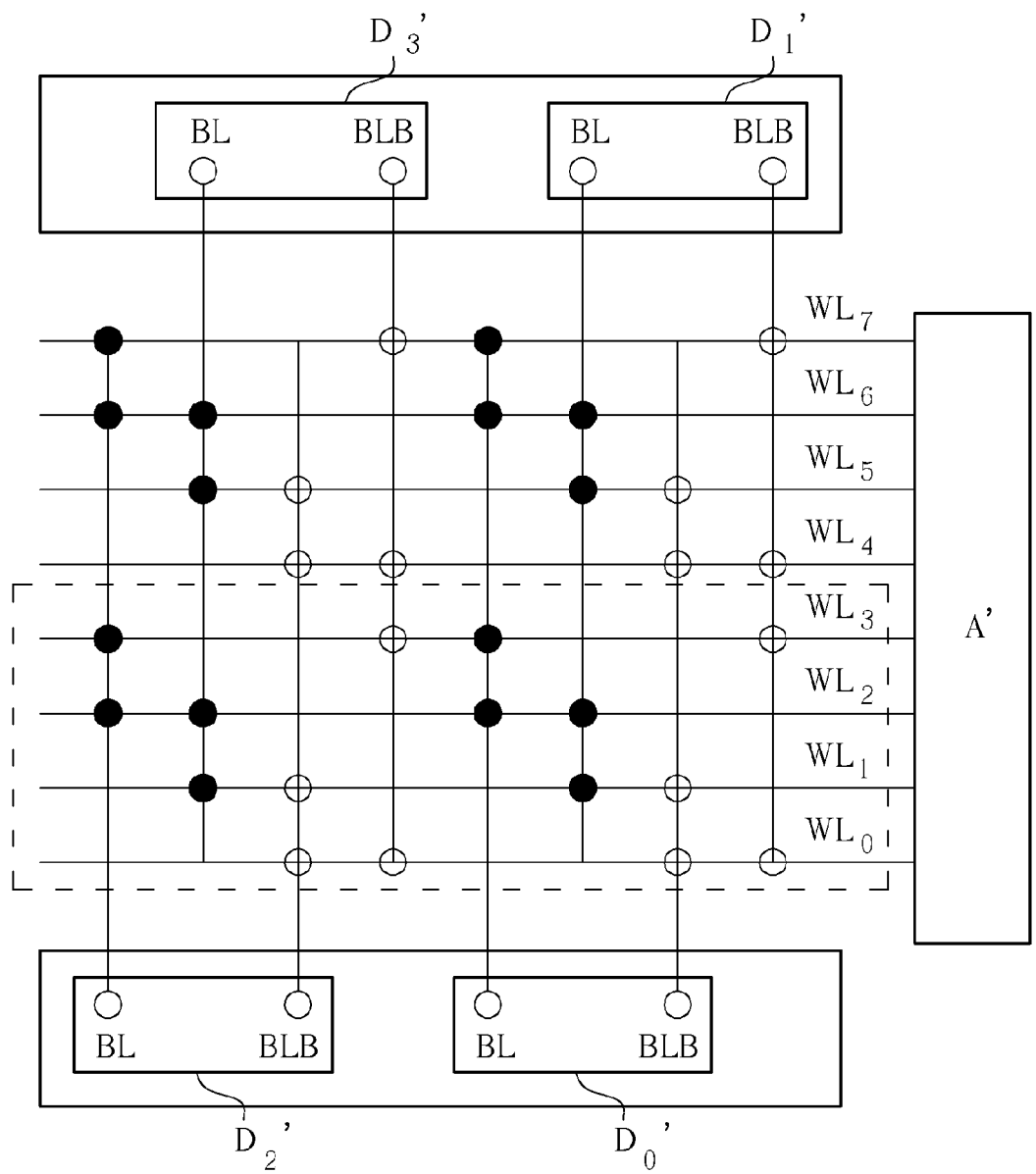

In one embodiment of the present invention, according to the dispositions disclosed in FIG. 7 and FIG. 8, it is known that the data type relates to the zeroth bit ($RA_0$) and the first bit ($RA_1$) of the row address RA. In one embodiment of the present invention, the encoding rules (1)~(4) can be described as follows:

(1) When the row address $RA_1$ equals logic "1", the encoders $EN_0$ and $EN_2$ output the testing data TD;

(2) When the row address $RA_1$ equals logic "0", the encoders $EN_0$ and $EN_2$ output the inverted testing data TD;

(3) When the exclusive OR calculation on the row addresses $RA_0$ and $RA_1$ equals logic "1", the encoders $EN_1$ and $EN_3$ output the testing data TD;

(4) When the exclusive OR calculation on the row addresses $RA_0$ and $RA_1$ equals logic "0", the encoders $EN_1$ and $EN_3$ output the inverted testing data TD.

Figure 12:
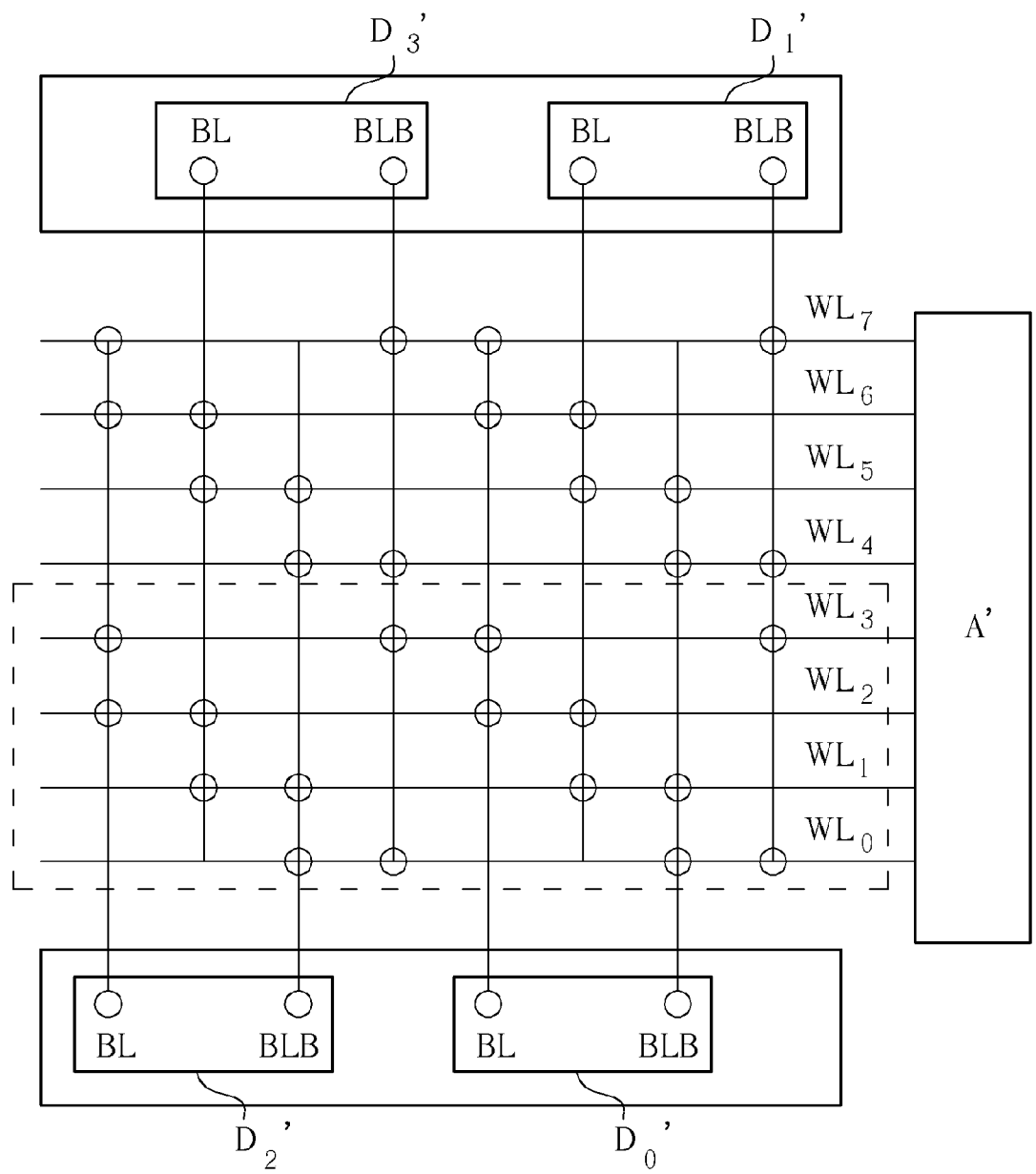
FIG. 12 is a diagram illustrating the testing system of the present invention writing the testing data of a first type during the testing procedure.
Figure 13:
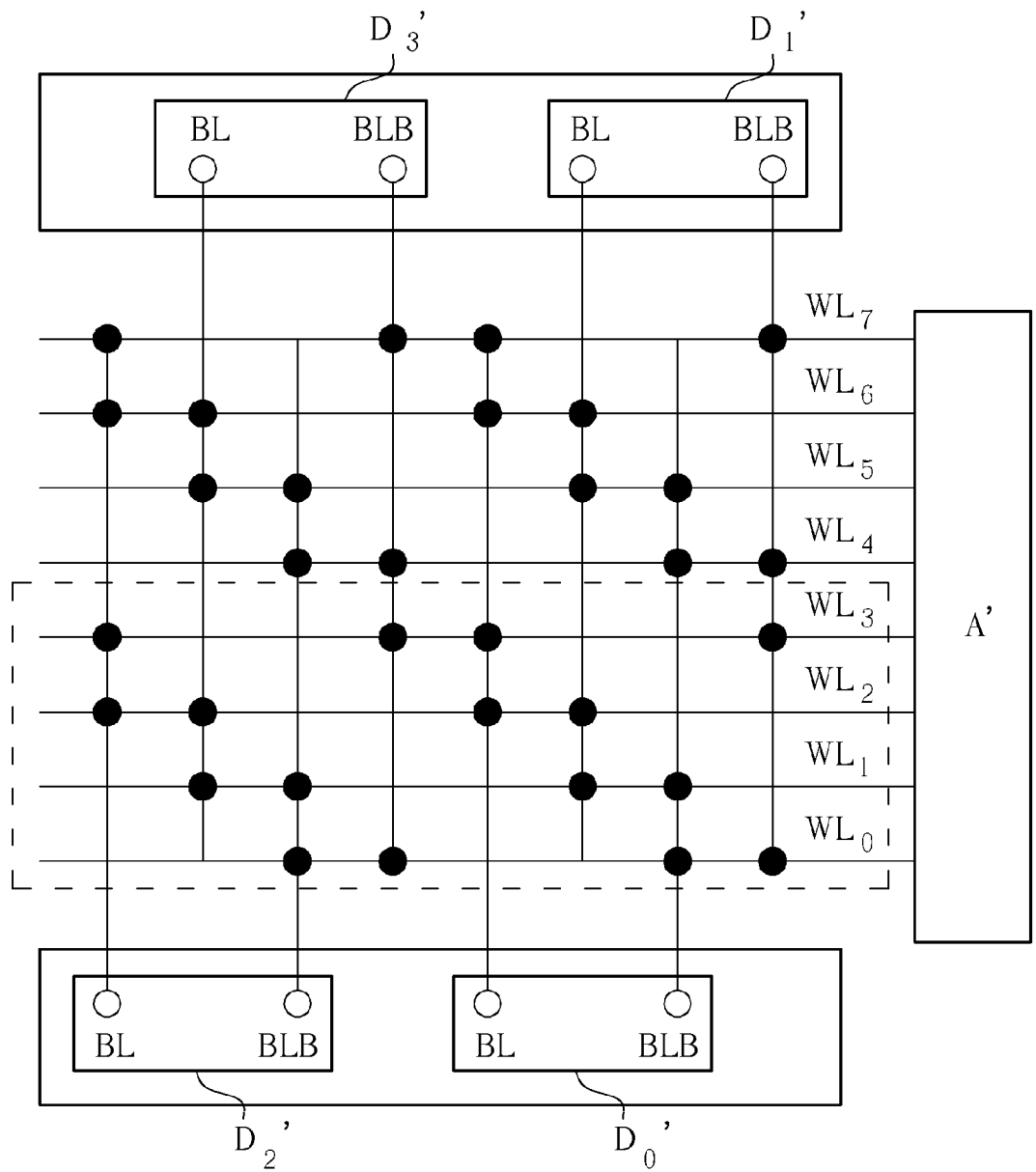
FIG. 13 is a diagram illustrating the testing system of the present invention writing the testing data of a second type during the testing procedure.

Please refer to FIG. 12 and FIG. 13 together. FIG. 12 is a diagram illustrating the testing system 910 of the present invention writing the testing data TD "1" during the testing procedure. FIG. 13 is a diagram illustrating the testing system 910 of the present invention writing the testing data TD "0" during the testing procedure. According to the aforementioned encoding rules (1)~(4), under the dispositions as shown in FIG. 12 and FIG. 13, the encoders $EN_0$~$EN_3$ correctly encodes the testing data TD and write the encoded testing data into each corresponding memory cell for allowing each of the corresponding memory cells storing same logic data. Thus, the testing system 910 of the present invention can apply to any kind of dispositions of the memory cells in DRAM instead of being limited to certain dispositions like the prior art.

Figure 14:
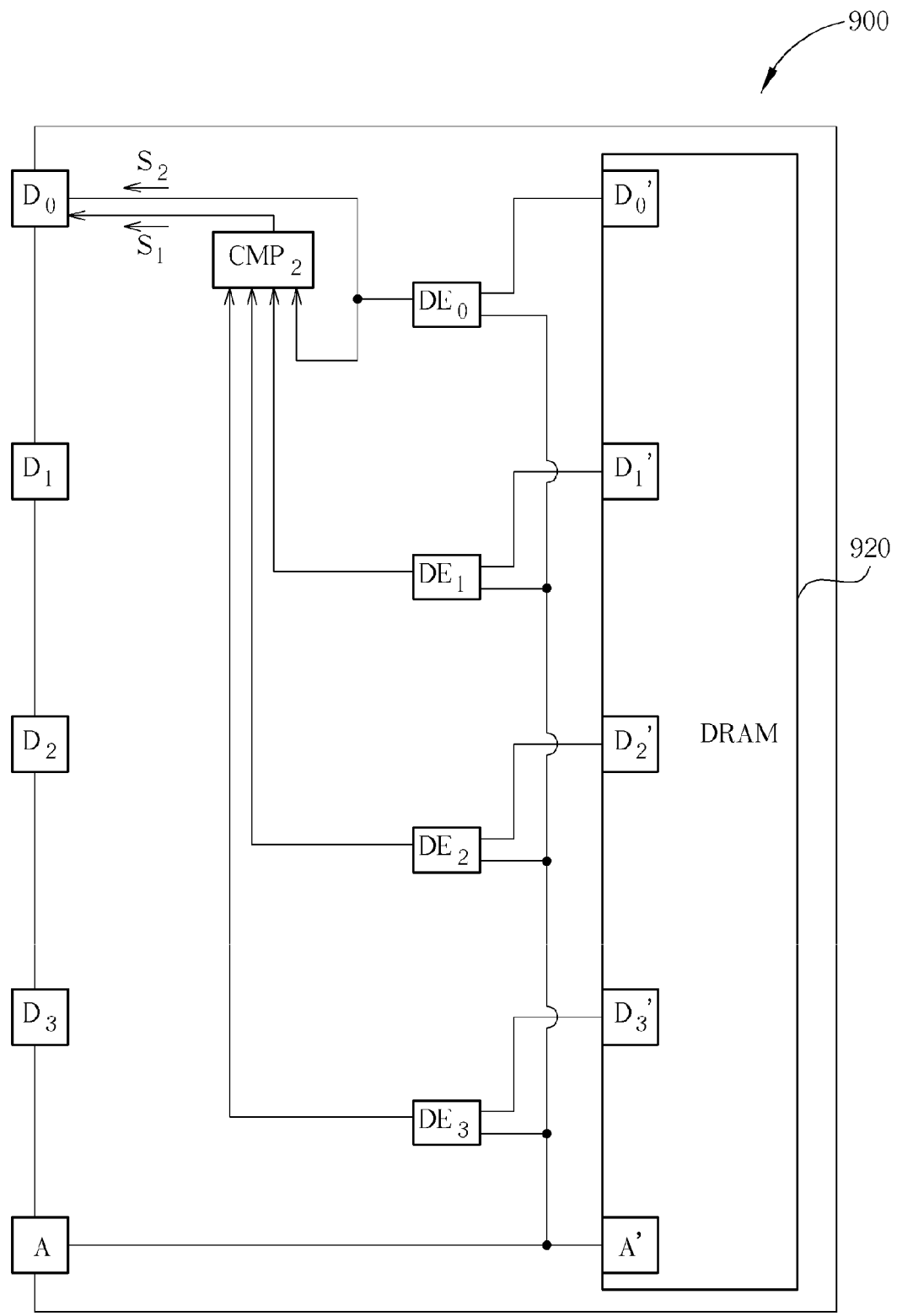
FIG. 14 is a diagram illustrating the testing system of the present invention during the reading phase of the testing procedure.

Please refer to FIG. 14. FIG. 14 is a diagram illustrating the testing system 910 of the present invention during the reading phase of the testing procedure. Similarly, the testing signal $S_T$ is generated to form the connection relationship as disclosed in FIG. 14. After the testing system 910 executes the testing procedure for writing as disclosed in FIG. 12 and FIG. 13, the testing system 910 executes a similar data compression method for reading out the testing data. That is, the testing system 910 inputs the same testing address RA at the address end A for transmitting to the corresponding address A' of the DRAM 920. In this way, the DRAM 920 outputs the data previously written during the testing procedure at the data ends $D_0'$, $D_1'$, $D_2'$, and $D_3'$, which are respectively transmitted to the input ends 2 of the decoders $DE_0$~$DE_3$. The decoders $DE_0$~$DE_3$ can decode the previously stored data of the corresponding memory cells according to the aforementioned encoding rules and the row address RA received by the input end 1 and transmit the decoded data respectively to the input ends 1, 2, 3, and 4 of the comparator $CMP_2$. The comparator $CMP_2$ compares the received data if they matches to each other and accordingly outputs a comparing signal $S_1$ to the data end $D_0$. The data end $D_0'$ also outputs the stored data, and the stored data is decoded by the decoder $DE_0$ to be the stored data $S_2$. The data $S_2$ is transmitted to the data end $D_0$. In this way, the memory cell corresponding to the row address RA can be determined if failed according to the comparing signal $S_1$, the stored data $S_2$, and the testing data TD. More particularly, when the comparing signal $S_1$ determines that data received by the comparator $CMP_2$ do not match to each other, the memory cell corresponding to the row address RA is determined to be failed; when the comparing signal $S_1$ determines that data received by the comparator $CMP_2$ match to each other, the stored data $S_2$ and the testing data TD have to be further compared for determining if the memory cell corresponding to the row address RA is failed. Under such condition, if the stored data $S_2$ matches the testing data TD, the memory cell corresponding to the row address RA is determined to be not failed; if the stored data $S_2$ does not match the testing data TD, the memory cell corresponding to the row address RA is determined to be failed.

To sum up, the testing system and the memory module provided by present invention effectively execute encoding/decoding according to the disposition of the memory cells of the memory, in order to utilize the method of data compressing for validating the memory cells of the memory, which speeds up the testing procedure and saves the testing time.

Those skilled in the art will readily observe that numerous modifications and alterations of the device and method may be made while retaining the teachings of the invention.

What is claimed is:

1. A testing system for a memory, the memory comprising a first memory cell, a second memory cell, a first data end, a second data end, and an address end, the testing system comprising:
   a third data end for receiving a testing data;
   a first encoder coupled to the third data end, the first data end, and the address end, for encoding the testing data to a first encoded data according to a testing address and transmitting the first encoded data to the first memory cell through the first data end; and
   a second encoder coupled to the third data end, the second data end, and the address end, for encoding the testing data to a second encoded data according to the testing address and transmitting the second encoded data to the second memory cell through the second data end.

2. The testing system of claim 1, further comprising:
   a first decoder coupled to the first data end, the address end, and the third data end, for reading the first encoded data from the first memory cell and decoding the first encoded data according to the testing address for generating a first decoded data;
   a second decoder coupled to the second data end, and the address end, for reading the second encoded data from the second memory cell and decoding the second encoded data according to the testing address for generating a second decoded data; and
   a comparator coupled to the first decoder and the second decoder for determining if the first decoded data and the second decoded data are the same.

3. The testing system of claim 2, wherein when the comparator determines the first decoded data is different from the second decoded data, the comparator generates a memory fail signal.

4. The testing system of claim 2, wherein when the comparator determines the first decoded data is the same as the second decoded data, but the first decoded data is different from the testing data, the comparator generates a memory fail signal.

5. The testing system of claim 2, wherein the first decoder decodes the first encoded data according to a first encoding rule of the first encoder for generating the first decoded data; the second decoder decodes the second encoded data according to a second encoding rule of the second encoder for generating the second decoded data.

6. A testing system for a memory, the memory comprising a first memory cell, a second memory cell, a first data end, a second data end, and an address end, the testing system comprising:
   a third data end for receiving a testing data;
   a first decoder coupled to the third data end, the first data end, and the address end, for reading a first encoded data from the first memory cell and decoding the first encoded data in order to generate a first decoded data according to a testing address;

a second decoder coupled to the second data end, and the address end, for reading a second encoded data from the second memory cell and decoding the second encoded data in order to generate a second decoded data according to the testing address; and a comparator coupled to the first decoder and the second decoder, for determining if the first decoded data and the second decoded data are the same.

7. The testing system of claim 6, wherein when the comparator determines the first decoded data is different from the second decoded data, the comparator generates a memory fail signal.

8. The testing system of claim 6, wherein when the comparator determines the first decoded data is the same as the second decoded data, but the first decoded data is different from the testing data, the comparator generates a memory fail signal.

9. The testing system of claim 6, further comprising:
a first encoder coupled to the third data end, the first data end, and the address end, for encoding the testing data to the first encoded data according to the testing address and transmitting the first encoded data to the first memory cell through the first data end; and a second encoder coupled to the third data end, the second data end, and the address end, for encoding the testing data to the second encoded data according to the testing address and transmitting the second encoded data to the second memory cell through the second data end.

10. The testing system of claim 9, wherein the first decoder decodes the first encoded data according to a first encoding rule of the first encoder for generating the first decoded data; the second decoder decodes the second encoded data according to a second encoding rule of the second encoder for generating the second decoded data.

11. A memory module, the memory module receiving a testing signal for being testing during a testing procedure, the memory module receiving a normal operation signal for operating regularly during a normal operation, the memory module comprising:
a third data end, for accessing data, and receiving a testing data when during the testing procedure;
a fourth data end, for accessing data;
a second address end, for receiving address information and receiving a testing address during the testing procedure;
a first switch, comprising:
a first end coupled to the third data end;
a control end for receiving the normal operation signal; and
a second end;
wherein when the control end of the first switch receives the normal operation signal, the first end of the first switch is coupled to the second end of the first switch;
a second switch, comprising:
a first end coupled to the fourth data end;
a control end for receiving the normal operation signal; and
a second end;
wherein when the control end of the second switch receives the normal operation signal, the first end of the second switch is coupled to the second end of the second switch;
a third switch, comprising:
a first end coupled to the third data end;
a control end for receiving the testing signal; and
a second end;
wherein when the control end of the third switch receives the testing signal, the first end of the third switch is coupled to the second end of the third switch;
a fourth switch, comprising:
a first end coupled to the third data end;
a control end for receiving the testing signal; and
a second end;
wherein when the control end of the fourth switch receives the testing signal, the first end of the fourth switch is coupled to the second end of the fourth switch;
a memory, comprising:
a first data end, coupled to the second end of the first switch;
a second data end, coupled to the second end of the second switch;
a first address end, coupled to the second address end, for receiving the address information and the testing address;
a first memory cell, coupled to the first data end and the first address end; and
a second memory cell, coupled to the second data end and the first address end;
a first encoder, coupled between the second end of the third switch, the first data end, and the second address end, for encoding the testing data to a first encoded data according to the testing address and transmitting the first encoded data to the first memory cell through the first data end; and
a second encoder, coupled between the second end of the fourth switch, the second data end, and the second address end, for encoding the testing data to a second encoded data according to the testing address and transmitting the second encoded data to the second memory cell through the second data end.

12. The memory module of claim 11, further comprising:
a fifth switch, comprising:
a first end coupled to the third data end;
a control end for receiving the testing signal; and
a second end;
wherein when the control end of the fifth switch receives the testing signal, the first end of the fifth switch is coupled to the second end of the fifth switch;
a first decoder coupled to the first data end, the second address end, and the second end of the fifth switch, for reading the first encoded data from the first memory cell and decoding the first encoded data in order to generate a first decoded data according to the testing address;
a second decoder coupled to the second data end, and the second address end, for reading the second encoded data from the second memory cell and decoding the second encoded data in order to generate a second decoded data according to the testing address; and
a comparator coupled to the first decoder and the second decoder, for determining if the first decoded data and the second decoded data are the same.

13. The memory module of claim 12, wherein when the comparator determines the first decoded data is different from the second decoded data, the comparator generates a memory fail signal.

14. The memory module of claim 12, wherein when the comparator determines the first decoded data is the same as the second decoded data, but the first decoded data is different from the testing data, the comparator generates a memory fail signal.

15. The memory module of claim 12, wherein the first decoder decodes the first encoded data according to a first encoding rule of the first encoder for generating the first decoded data; the second decoder decodes the second encoded data according to a second encoding rule of the second encoder for generating the second decoded data.

16. A memory module, the memory module receiving a testing signal for being testing during a testing procedure, the memory module receiving a normal operation signal for operating regularly during a normal operation, the memory module comprising:
- a third data end, for accessing data, and receiving a testing data when during the testing procedure;
- a fourth data end, for accessing data;
- a second address end, for receiving address information and receiving a testing address during the testing procedure;
- a first switch, comprising:
  - a first end coupled to the third data end;
  - a control end for receiving the normal operation signal; and
  - a second end;
  - wherein when the control end of the first switch receives the normal operation signal, the first end of the first switch is coupled to the second end of the first switch;
- a second switch, comprising:
  - a first end coupled to the fourth data end;
  - a control end for receiving the normal operation signal; and
  - a second end;
  - wherein when the control end of the second switch receives the normal operation signal, the first end of the second switch is coupled to the second end of the second switch;
- a fifth switch, comprising:
  - a first end coupled to the third data end;
  - a control end for receiving the testing signal; and
  - a second end;
  - wherein when the control end of the fifth switch receives the testing signal, the first end of the fifth switch is coupled to the second end of the fifth switch;
- a memory, comprising:
  - a first data end, coupled to the second end of the first switch;
  - a second data end, coupled to the second end of the second switch;
  - a first address end, coupled to the second address end, for receiving the address information and the testing address;
  - a first memory cell, coupled to the first data end and the first address end; and
  - a second memory cell, coupled to the second data end and the first address end;
- a first decoder coupled to the first data end, the second address end, and the second end of the fifth switch, for reading a first encoded data from the first memory cell and decoding the first encoded data in order to generate a first decoded data according to the testing address;
- a second decoder coupled to the second data end, and the second address end, for reading a second encoded data from the second memory cell and decoding the second encoded data in order to generate a second decoded data according to the testing address; and
- a comparator coupled to the first decoder and the second decoder, for determining if the first decoded data and the second decoded data are the same.

17. The memory module of claim 16, wherein when the comparator determines the first decoded data is different from the second decoded data, the comparator generates a memory fail signal.

18. The memory module of claim 16, wherein when the comparator determines the first decoded data is the same as the second decoded data, but the first decoded data is different from the testing data, the comparator generates a memory fail signal.

19. The memory module of claim 16, further comprising:
- a third switch, comprising:
  - a first end coupled to the third data end;
  - a control end for receiving the testing signal; and
  - a second end;
  - wherein when the control end of the third switch receives the testing signal, the first end of the third switch is coupled to the second end of the third switch;
- a fourth switch, comprising:
  - a first end coupled to the third data end;
  - a control end for receiving the testing signal; and
  - a second end;
  - wherein when the control end of the fourth switch receives the testing signal, the first end of the fourth switch is coupled to the second end of the fourth switch;
- a first encoder coupled between the second end of the third switch, the first data end, and the second address end, for encoding the testing data to the first encoded data according to the testing address and transmitting the first encoded data to the first memory cell through the first data end; and
- a second encoder coupled between the second end of the fourth switch, the second data end, and the second address end, for encoding the testing data to the second encoded data according to the testing address and transmitting the second encoded data to the second memory cell through the second data end.

20. The memory module of claim 19, wherein the first decoder decodes the first encoded data according to a first encoding rule of the first encoder for generating the first decoded data; the second decoder decodes the second encoded data according to a second encoding rule of the second encoder for generating the second decoded data.

* * * * *